United States Patent
Kim et al.

(10) Patent No.: US 11,696,508 B2
(45) Date of Patent: Jul. 4, 2023

(54) SOUND VIBRATION SENSOR USING PIEZOELECTRIC ELEMENT HAVING CANTILEVER STRUCTURE

(71) Applicant: EM-TECH Co., Ltd., Gyeongsangnam-do (KR)

(72) Inventors: Cheon Myeong Kim, Gyeongsangnam-do (KR); Byung Min Yu, Seoul (KR); Jae Hwa Lim, Gyeongsangnam-do (KR); Jeong Ae Ha, Gyeongsangnam-do (KR); Ji Young Lee, Gyeongsangnam-do (KR); Byung Ho Jung, Gyeongsangnam-do (KR)

(73) Assignee: EM-TECH Co., Ltd., Gyeongsangnam-do (KR)

( * ) Notice: Subject to any disclaimer, the term of this patent is extended or adjusted under 35 U.S.C. 154(b) by 440 days.

(21) Appl. No.: 17/107,993

(22) Filed: Dec. 1, 2020

(65) Prior Publication Data
US 2021/0167275 A1 Jun. 3, 2021

(30) Foreign Application Priority Data
Dec. 2, 2019 (KR) .......................... 10-2019-0158043

(51) Int. Cl.
*H01L 41/113* (2006.01)
*H01L 41/053* (2006.01)
(Continued)

(52) U.S. Cl.
CPC ......... *H10N 30/306* (2023.02); *H10N 30/886* (2023.02)

(58) Field of Classification Search
CPC ........................... H10N 30/306; H10N 30/886
(Continued)

(56) References Cited

U.S. PATENT DOCUMENTS

| 2010/0007243 A1 | 1/2010 | Engel |
| 2014/0098978 A1 | 4/2014 | Fukuoka et al. |
| 2016/0079886 A1 * | 3/2016 | Hasegawa .............. H02K 35/00 310/319 |

FOREIGN PATENT DOCUMENTS

| CN | 1257399 A | 6/2000 |
| CN | 205793132 U | 12/2016 |

(Continued)

*Primary Examiner* — Shawki S Ismail
*Assistant Examiner* — Monica Mata
(74) *Attorney, Agent, or Firm* — Murphy, Bilak & Homiller, PLLC

(57) ABSTRACT

Disclosed is a sound vibration sensor using a piezoelectric element having a cantilever structure. The sound vibration sensor includes a housing forming an exterior, a piezoelectric element having a cantilever structure installed in the housing, a support structure supporting a fixed end of the piezoelectric element, a weight attached to a free end of the piezoelectric element, and an energizing part configured to transmit an output from the piezoelectric element, wherein the sound vibration sensor comes into contact with a speaker's body, receives vibration of the body generated when the speaker utters a sound through the housing, and amplifies the vibration by the free end of the piezoelectric element to detect the voice vibration of the speaker using a piezoelectric characteristic of the piezoelectric element.

11 Claims, 5 Drawing Sheets

(51) Int. Cl.
*H10N 30/30* (2023.01)
*H10N 30/88* (2023.01)

(58) Field of Classification Search
USPC .......................................................... 310/328
See application file for complete search history.

(56) References Cited

FOREIGN PATENT DOCUMENTS

| | | | |
|---|---|---|---|
| CN | 208434106 U | 1/2019 |
| EP | 0999723 A2 | 5/2000 |
| EP | 1777986 A2 | 4/2007 |
| JP | 2006116399 A | 5/2006 |
| JP | 2011129971 A | 6/2011 |
| KR | 20070067089 A | 6/2007 |
| KR | 101224174 B1 | 1/2013 |
| KR | 101332006 B1 | 11/2013 |
| KR | 20150005924 A | 1/2015 |

\* cited by examiner

SOUND VIBRATION SENSOR USING PIEZOELECTRIC ELEMENT HAVING CANTILEVER STRUCTURE

TECHNICAL FIELD

The present disclosure relates to a piezoelectric sound vibration sensor having a cantilever structure.

BACKGROUND

Conventional earsets having a structure with an external microphone has a disadvantage in that a speaker's voice cannot be clearly transmitted to a counterpart according to noise of a surrounding environment when making a call or performing simultaneous translation. Therefore, instead of the external microphone, an earset having a sound vibration microphone capable of detecting a user's voice vibration at a location in direct or indirect contact with the user's skin has been developed.

FIG. 1 is a diagram schematically showing an earset including a sound vibration microphone according to the related art.

The ear set 1 is worn on or inserted through the user's ear canal 2, and the user's voice is transmitted to the earset 1 through a bone 3. That is, when the user speaks, the bone vibrates, and a voice vibration recognition sensor senses the vibration of the bone, whereby the user's voice may be clearly transmitted to the counterpart in a noisy environment.

SUMMARY

Therefore, an aspect of the present disclosure provides a piezoelectric sound vibration sensor having a cantilever structure.

According to an aspect of the present disclosure, there is provided a sound vibration sensor using a piezoelectric element having a cantilever structure, including: a housing forming an exterior; a piezoelectric element having a cantilever structure installed in the housing; a support structure supporting a fixed end of the piezoelectric element; a weight attached to a free end of the piezoelectric element; and an energizing part transmitting an output from the piezoelectric element, wherein the sound vibration sensor comes into contact with a speaker's body, receives vibration of the body generated when the speaker utters a sound through the housing, and amplifies the vibration by the free end of the piezoelectric element to detect the voice vibration of the speaker using a piezoelectric characteristic of the piezoelectric element.

As another example of the present disclosure, the fixed portion of the piezoelectric element fixed by the support structure may be 40% or less of a total volume.

In addition, as another example of the present disclosure, a thickness of the piezoelectric element may be 0.3 mm or greater.

In addition, as another example of the present disclosure, a weight of the weight may be 5 mg or greater.

In addition, as another example of the present disclosure, the weight may be formed of metals having a density of 5 or greater.

In addition, as another example of the present disclosure, the support structure may be formed by a curved structure of the housing.

In addition, as another example of the present disclosure, two or more piezoelectric elements having different thicknesses may be provided.

In addition, as another example of the present disclosure, upper surfaces of the two or more piezoelectric elements may be coplanar.

In addition, as another example of the present disclosure, the sound vibration sensor may further include: a damping structure for preventing damage to the piezoelectric element.

In addition, as another example of the present disclosure, the damping structure is a polyurethane foam or a damping bond attached to the housing.

In addition, as another example of the present disclosure, the sound vibration sensor may further include: a reinforcing plate attached to a lower surface of the piezoelectric element to prevent damage to the piezoelectric element.

In addition, as another example of the present disclosure, the sound vibration sensor may further include: a spring installed between the free end of the piezoelectric element and the housing.

In addition, as another example of the present disclosure, the sound vibration sensor may further include: an amplifier installed on the energizing part and amplifying a signal from the piezoelectric element.

Since the piezoelectric sound vibration sensor having the cantilever structure provided by the present disclosure detects vibration generated by a speaker's voice using the piezoelectric element, external noise may be fundamentally blocked.

In addition, the piezoelectric sound vibration sensor having a cantilever structure provided by the present disclosure has excellent vibration detection capability because the piezo element has the cantilever structure.

Those skilled in the art will recognize additional features and advantages upon reading the following detailed description, and upon viewing the accompanying drawings.

DETAILED DESCRIPTION

Hereinafter, the present disclosure will be described in detail with reference to the accompanying drawings.

Figure 1:
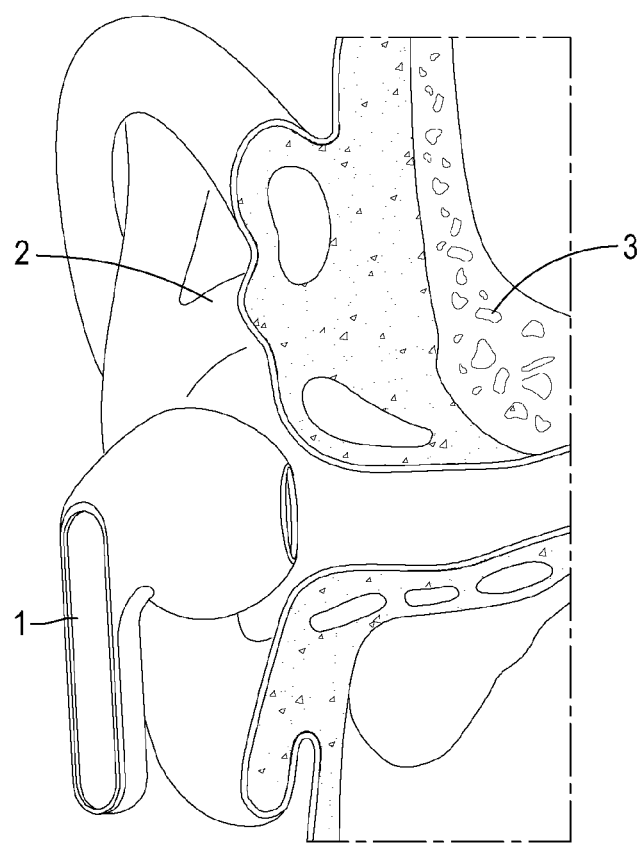
FIG. 1 is a diagram schematically showing an earset including a sound vibration microphone according to the related art.
Figure 2:
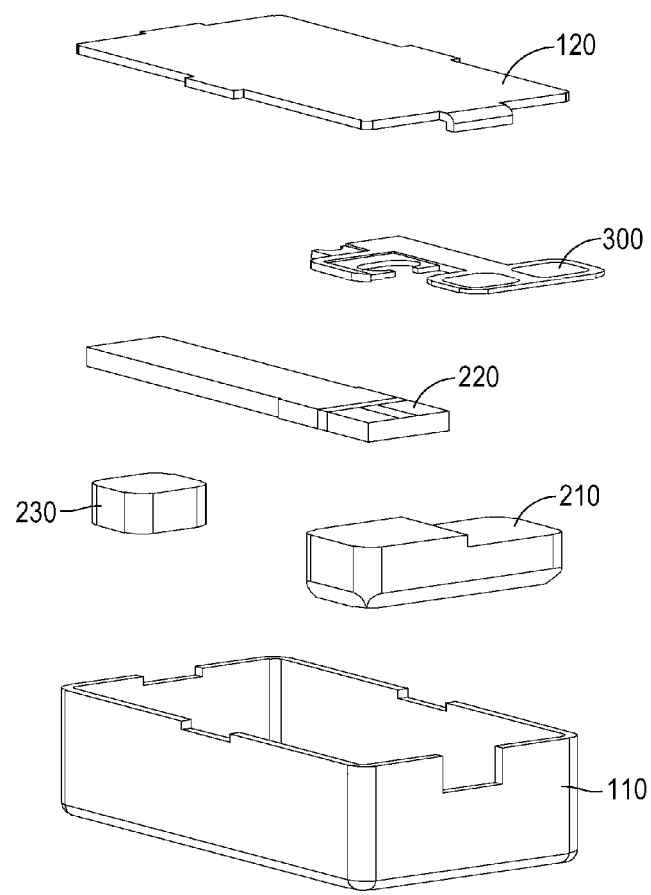
FIG. 2 is an exploded view of a sound vibration sensor using a piezoelectric element having a cantilever structure according to a first embodiment of the present disclosure.
Figure 3:
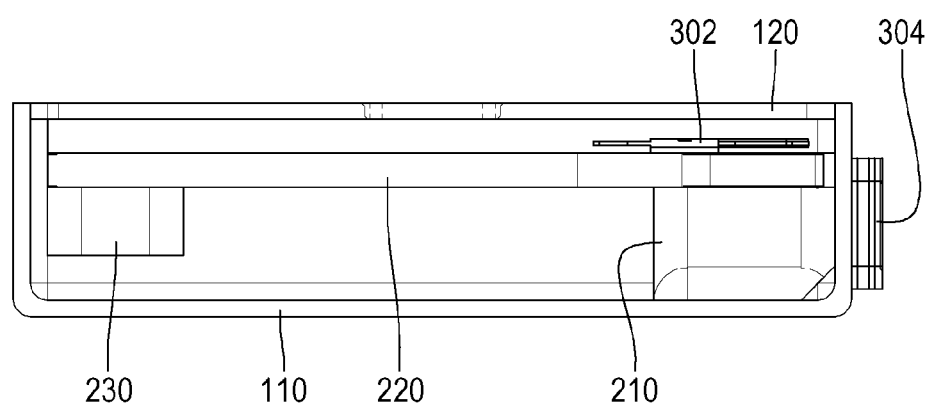
FIG. 3 is a cross-sectional view of a sound vibration sensor using a piezoelectric element having a cantilever structure according to the first embodiment of the present disclosure.

FIG. 2 is an exploded view of a sound vibration sensor using a piezoelectric element having a cantilever structure according to a first embodiment of the present disclosure, and FIG. 3 is a cross-sectional view of a sound vibration sensor using a piezoelectric element having a cantilever structure according to the first embodiment of the present disclosure.

In the sound vibration sensor using a piezoelectric element having a cantilever structure (hereinafter, referred to as a "sound vibration sensor") according to the first embodiment of the present disclosure, a housing including a lower housing 110 and an upper housing 120 forms an exterior and components for sensing vibrations are installed in the housing.

The lower housing 110 has a lower surface and side walls, having a box shape with an opened upper surface, and the upper housing 120 is coupled to the lower housing 110 to close the opened upper surface. A piezoelectric element 220 in the form of a strip having a length greater than a thickness or a width is installed in the lower housing 110. Here, one end of the piezoelectric element 220 is fixed and the other end thereof is a free end, having a cantilever structure. The piezoelectric element 220 is preferably formed of a PZT ceramic material.

A support structure 210 supporting the fixed end of the piezoelectric element 220 is provided in the lower housing 110. It is preferable that the fixed portion of the piezoelectric element 220 fixed by the support structure 210 is 40% or less of a total volume. This is because if the volume of the fixed portion of the piezoelectric element 220 increases, a vibration width of the free end is reduced to limit a detection range of sound vibration.

Meanwhile, a weight 230 is attached to the free end of the piezoelectric element 220. The weight 230 has the advantage of amplifying vibration of the piezoelectric element 220, thereby increasing the detection range of sound vibration of the sound vibration sensor. Here, the weight 230 is preferably 5 mg or greater in weight. If the weight is smaller, the vibration amplification effect of the weight 230 decreases, and thus the weight is preferably 5 mg or greater in weight in order to increase detection efficiency of the piezoelectric element 220 and minimize noise. Meanwhile, it is preferable that the weight 230 is formed of metals having a density of 5 or greater that may reduce the volume and increase the weight. Here, the weight 230 may have any shape as long as the weight 230 is attached to the piezoelectric element 220, without limiting vibration of the piezoelectric element 220. For example, the weight 230 may have any shape such as a cylinder shape, a cap shape surrounding the free end of the piezoelectric element 220, a rectangular parallelepiped or a regular cube. The weight 230 may be attached to the piezoelectric element 220 by an adhesive member such as a bond or tape.

Meanwhile, an energizing part (or a conductive part) 300 capable of transmitting an output of the piezoelectric element 220 is connected to the fixed end side of the piezoelectric element 220. One end 302 of the energizing part 300 is connected to the piezoelectric element 220 within the housings 110 and 120 and the other end 304 of the energizing part 300 is drawn out of the housings 110 and 120 to form a contact point with the outside.

The sound vibration sensor detects vibration generated by a speaker's voice transmitted through the housings 110 and 120 using piezoelectric characteristics of the piezoelectric element 220. The piezoelectric element 220 is installed in a cantilever structure and vibrations of the housings 110 and 120 are amplified at the free end, and thus the piezoelectric element 220 may sensitively detect sound vibration. In addition, since it is attached to the speaker's body and detects vibration generated when a voice is spoken, external noise cannot be detected by a sensor. Therefore, if the sound vibration sensor is used as a microphone, external noise may be fundamentally blocked.

Figure 4:
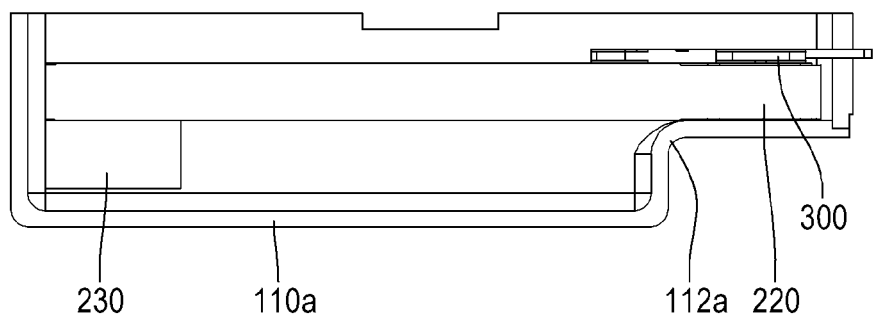
FIG. 4 is a cross-sectional view of a sound vibration sensor using a piezoelectric element having a cantilever structure according to a second embodiment of the present disclosure.

FIG. 4 is a cross-sectional view of a sound vibration sensor using a piezoelectric element having a cantilever structure according to a second embodiment of the present disclosure.

The sound vibration sensor according to the second embodiment of the present disclosure also includes the housing, the piezoelectric element 220, a weight 230, and the energizing part 300. However, the support structure for supporting a fixed end of the piezoelectric element 220 is not separately attached to the lower housing 110a. Instead, a portion of the lower housing 110a is bent inward to form a support structure 112a capable of supporting the piezoelectric element 220.

Figure 5:
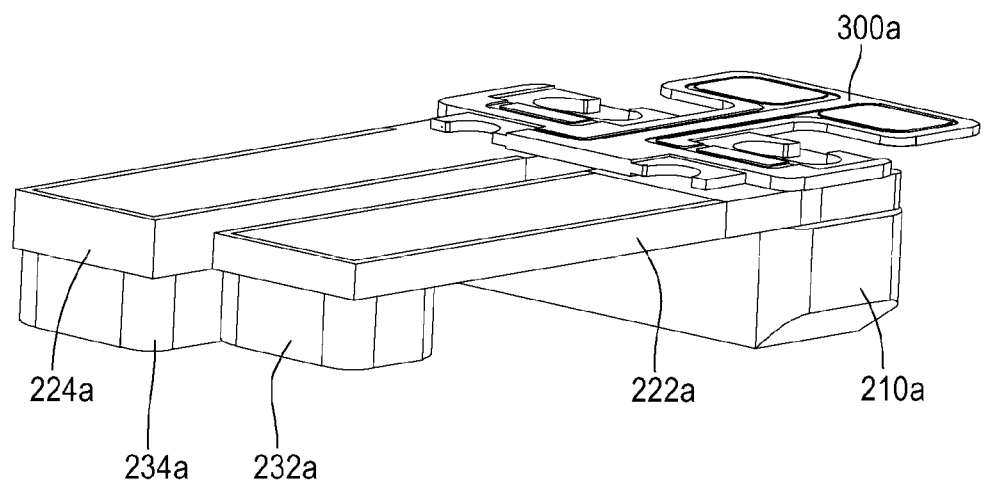
FIG. 5 is a perspective view showing components other than a housing of a sound vibration sensor using a piezoelectric element having a cantilever structure according to a third embodiment of the present disclosure.

FIG. 5 is a perspective view showing components excluding a housing of a sound vibration sensor using a piezoelectric element having a cantilever structure according to a third embodiment of the present disclosure.

A sound vibration sensor according to the third embodiment of the present disclosure is different from the previous embodiments in that it includes two piezoelectric elements 222a and 224a and two weights 232a and 234a. In the third embodiment of the present disclosure, two piezoelectric elements 222a and 224a are provided, but three or more may also be provided. When a plurality of piezoelectric elements 222a and 224a are provided, there is an advantage in that a detection range for detecting voice vibration is increased. In this case, the piezoelectric elements 222a and 224a may have different thicknesses, thereby increasing accuracy of voice vibration detection. By varying the thickness of the piezoelectric elements 222a and 224a, not only amplitudes of free ends of the piezoelectric elements 222a and 224a are changed but also the piezoelectric characteristics are different, and thus accuracy of voice sensing may be increased by combining signals generated at the piezoelectric elements 222a and 224a.

Here, when the thicknesses of the piezoelectric elements 222a and 224a are different from each other, upper surfaces of the piezoelectric elements 222a and 224a may have the same height, i.e., may be coplanar, by varying heights of portions supporting the piezoelectric elements 222a and 224a in the support structure 210a. The energizing part 300a may be easily attached by arranging the upper surfaces of the piezoelectric elements 222a and 224a to be coplanar.

Figure 6:
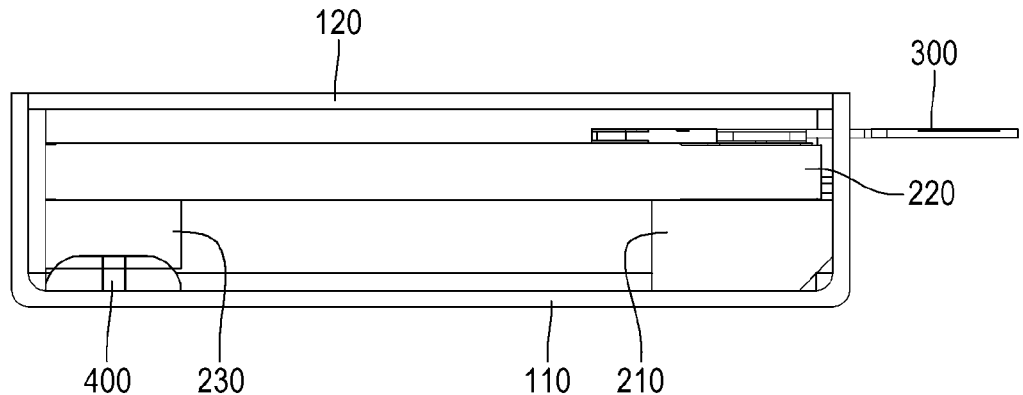
FIG. 6 is a cross-sectional view of a sound vibration sensor using a piezoelectric element having a cantilever structure according to a fourth embodiment of the present disclosure.
Figure 7:
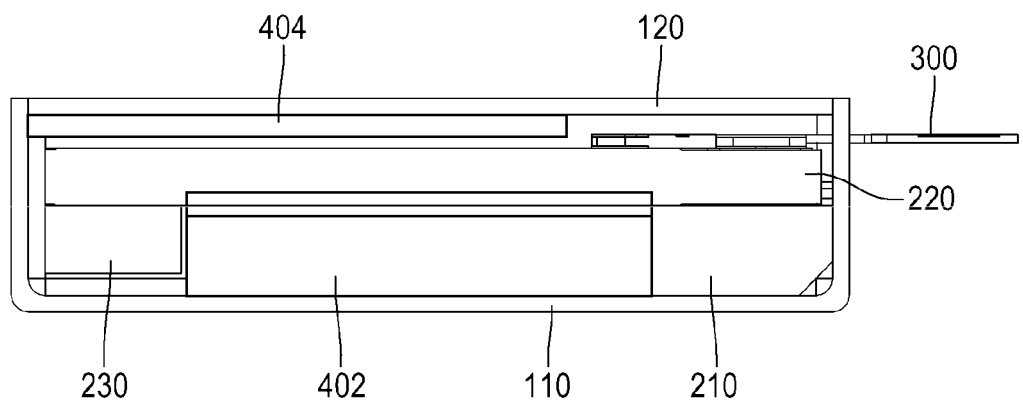
FIG. 7 is a cross-sectional view of a sound vibration sensor using a piezoelectric element having a cantilever structure according to a fifth embodiment of the present disclosure.

FIG. 6 is a cross-sectional view of a sound vibration sensor using a piezoelectric element having a cantilever structure according to a fourth embodiment of the present disclosure. FIG. 7 is a cross-sectional view of a sound vibration sensor using a piezoelectric element having a cantilever structure according to a fifth embodiment of the present disclosure. The sound vibration sensor according to the fourth embodiment of the present disclosure and the sound vibration sensor according to the fifth embodiment of the present disclosure have a damping structure for preventing damage to the piezoelectric element 220. In the fourth embodiment of the present disclosure, a damping bond 400 is applied on the lower housing 110 at a position close to the weight 230. In the fifth embodiment of the present disclosure, polyurethane foams (such as PORON®) 402 and 404 are attached to the lower housing 110 and the upper housing 120. The polyurethane foams 402 and 404 are appropriately disposed in empty spaces in the housings 110 and 120 and prevent impact from being applied to the piezoelectric element 220 due to a fall or the like.

Figure 8:
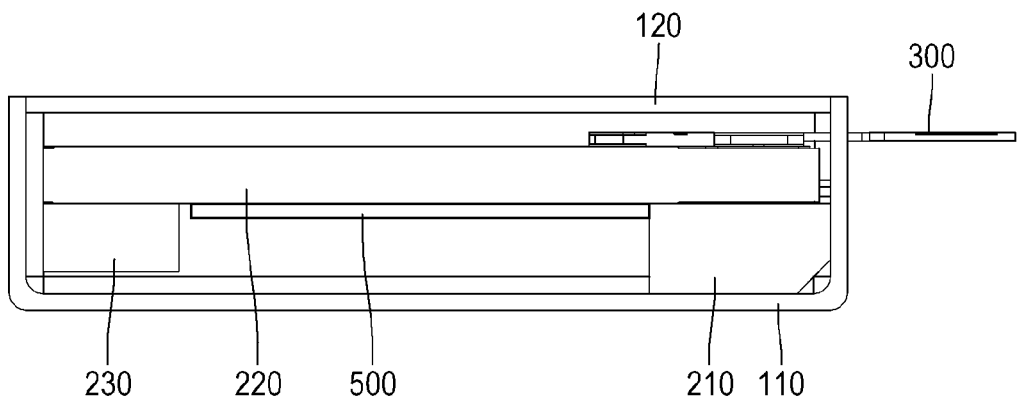
FIG. 8 is a cross-sectional view of a sound vibration sensor using a piezoelectric element having a cantilever structure according to a sixth embodiment of the present disclosure.

FIG. 8 is a cross-sectional view of a sound vibration sensor using a piezoelectric element having a cantilever structure according to a sixth embodiment of the present disclosure. The sound vibration sensor according to the sixth embodiment of the present disclosure includes a reinforcing plate 500 attached to the piezoelectric element 220 in order to prevent damage to the piezoelectric element 220. The reinforcing plate 500 does not serve to damp but may prevent the piezoelectric element 220 from being damaged.

Figure 9:
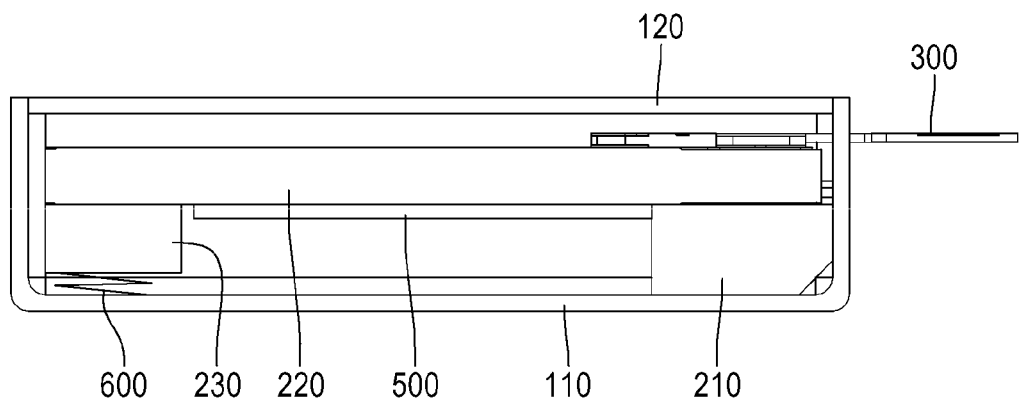
FIG. 9 is a cross-sectional view of a sound vibration sensor using a piezoelectric element having a cantilever structure according to a seventh embodiment of the present disclosure.

FIG. 9 is a cross-sectional view of a sound vibration sensor using a piezoelectric element having a cantilever structure according to a seventh embodiment of the present disclosure. The sound vibration sensor according to the seventh embodiment of the present disclosure includes the reinforcing plate 500 attached to the piezoelectric element 220 to prevent damage to the piezoelectric element 220 as in the sixth embodiment. In addition, an elastic member 600 is provided between the free end of the piezoelectric element 220 and the housing. The elastic member 600 serves to damp vibration of the free end. In the seventh embodiment of the present disclosure, the elastic member 600 is installed between the weight 230 attached to a lower portion of the free end of the piezoelectric element 220 and the lower housing 110. However, the installation position of the weight 230 and the elastic member 600 may be changed as necessary.

Figure 10:
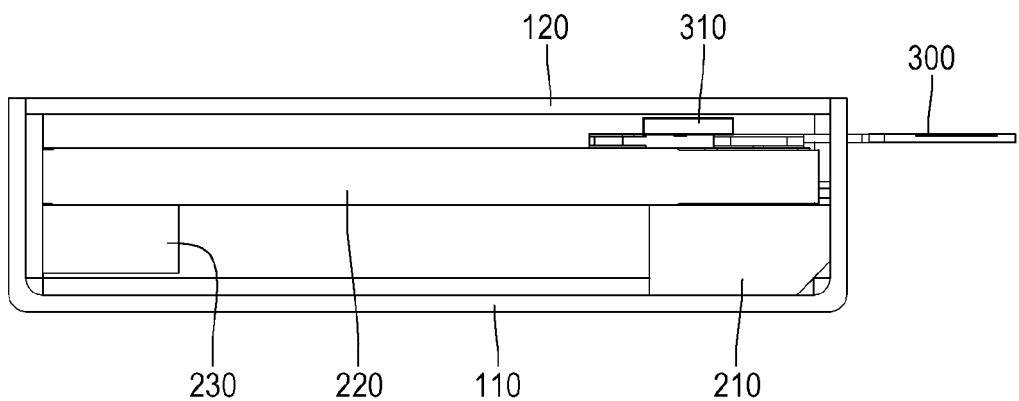
FIG. 10 is a cross-sectional view of a sound vibration sensor using a piezoelectric element having a cantilever structure according to an eighth embodiment of the present disclosure.

FIG. 10 is a cross-sectional view of a sound vibration sensor using a piezoelectric element having a cantilever structure according to an eighth embodiment of the present disclosure. Similar to the previous embodiments, the sound vibration sensor according to the eighth embodiment of the present disclosure includes the housings 110 and 120, the support structure 210, the piezoelectric element 220, the weight 230, and the energizing part 300. Here, an amplifier 310 for amplifying a signal of the piezoelectric element 220 may be provided on the energizing part 300.

As described above, the present invention is not limited to the above-described examples and various modifications may be made by a person skilled in the art to which the present invention pertains, without departing from the spirit of the invention as defined by the claims of the present invention, and such modifications also fall within the claims.

What is claimed is:

1. A sound vibration sensor using a piezoelectric element having a cantilever structure, the sound vibration sensor comprising:
   a housing forming an exterior;
   two or more piezoelectric elements having different thicknesses and having a cantilever structure installed in the housing, wherein upper surfaces of the two or more piezoelectric elements are coplanar;
   a support structure supporting fixed ends of the two or more piezoelectric elements;
   two or more weights each weight attached to a free end of one of the two or more piezoelectric elements; and
   an energizing part configured to transmit an output from the two or more piezoelectric elements,
   wherein the sound vibration sensor comes into contact with a speaker's body, receives a voice vibration of the speaker's body generated when the speaker's body utters a sound through the housing, and amplifies the voice vibration by the free end of each of the two or more piezoelectric elements to detect the voice vibration of the speaker using a piezoelectric characteristic of the two or more piezoelectric elements.

2. The sound vibration sensor of claim 1, wherein a fixed portion of each of the two or more piezoelectric elements fixed by the support structure is 40% or less of a total volume.

3. The sound vibration sensor of claim 1, wherein a thickness of each of the two or more piezoelectric elements is 0.3 mm or greater.

4. The sound vibration sensor of claim 1, wherein a weight of each of the two or more weights is 5 mg or greater.

5. The sound vibration sensor of claim 1, wherein the two or more weights are formed of metals having a density of 5 or greater.

6. The sound vibration sensor of claim 1, wherein the support structure is formed by a curved structure of the housing.

7. The sound vibration sensor of claim 1, further comprising: an amplifier installed on the energizing part and configured to amplify a signal from the two or more piezoelectric elements.

8. The sound vibration sensor of claim 1, further comprising: a damping structure configured to prevent damage to the two or more piezoelectric elements.

9. The sound vibration sensor of claim 8, wherein the damping structure is a polyurethane foam or a damping bond attached to the housing.

10. The sound vibration sensor of claim 1, further comprising: a reinforcing plate attached to lower surfaces of the two or more piezoelectric elements and configured to prevent damage to the two or more piezoelectric elements.

11. The sound vibration sensor of claim 10, further comprising: a spring installed between the free end of each of the two or more piezoelectric elements and the housing.

* * * * *